United States Patent [19]
Grover

[11] Patent Number: 6,055,148
[45] Date of Patent: Apr. 25, 2000

[54] SEMICONDUCTOR DEVICE ASSEMBLIES AND CIRCUITS

[75] Inventor: Raymond J. Grover, Manchester, United Kingdom

[73] Assignee: U.S. Philips Corporation, New York, N.Y.

[21] Appl. No.: 09/116,768

[22] Filed: Jul. 16, 1998

[30] Foreign Application Priority Data

Jul. 19, 1997 [GB] United Kingdom ............... 9715168
Jan. 22, 1998 [GB] United Kingdom ............... 9801240

[51] Int. Cl.⁷ ....................................... H02H 5/04
[52] U.S. Cl. ............................. 361/103; 257/762
[58] Field of Search .................... 361/103–104; 257/181, 623, 688–689, 762

[56] References Cited

U.S. PATENT DOCUMENTS

| | | | |
|---|---|---|---|
| 3,652,904 | 3/1972 | Takahashi et al. | 257/785 |
| 4,246,596 | 1/1981 | Iwasaki | 257/689 |
| 4,402,004 | 8/1983 | Iwasaki | 257/689 |
| 4,802,099 | 1/1989 | Logue | 364/491 |
| 5,250,821 | 10/1993 | Ferla et al. | 257/181 |
| 5,444,219 | 8/1995 | Kelly | 219/505 |
| 5,563,760 | 10/1996 | Lowis et al. | 361/103 |

FOREIGN PATENT DOCUMENTS

| | | |
|---|---|---|
| 5892231 | 6/1983 | Japan . |
| 06005778 | 1/1994 | Japan . |
| 2037075 | 7/1980 | United Kingdom . |
| 9625839A1 | 8/1996 | WIPO . |
| WO9702592 | 1/1997 | WIPO . |

*Primary Examiner*—Michael J. Sherry
*Attorney, Agent, or Firm*—Steven R. Biren

[57] ABSTRACT

A semiconductor device assembly comprises within an envelope (100) one or more upper component bodies (102, 103) mounted on a lower component body (101) to provide a low-cost, yet reliable half-bridge or full-bridge driver or rectifier circuit or a solenoid driver circuit or the like. Each component body (101, 102, 103) comprises a power MOSFET, IGBT, Schottky diode and/or other semiconductor component. A bottom main electrode (29a) of the lower body (101) is bonded to a mounting pad (130) in the envelope (100). Electrical connections (150) are bonded from conductor leads (140) of the envelope lead frame (130, 140) to respective bonding pads (124a/b/c, and 121a/b/c) of the top electrodes (24a/b/c; (21a/b/c) of the bodies (101, 102, 103). The lead-frame connection (150) to the bottom electrode (29b/d) of the upper body (102, 103) is via the top main electrode (24a/c) of the lower body (101), to which it is bonded without covering the electrode bonding pads (124a/c, 121a/c) of the lower body (101). A large mounting area for the upper body/bodies (102, 103) and good thermal protection for the whole assembly is achieved by including in the lower body (101) a thermal-overload protection circuit (D1, Q1 . . . ) which has a temperature sensor (D1) at a location adjacent to the area of the top surface of the lower body (101) where the upper body (102) or bodies (102, 103) is/are mounted.

11 Claims, 5 Drawing Sheets

SEMICONDUCTOR DEVICE ASSEMBLIES AND CIRCUITS

BACKGROUND OF THE INVENTION

This invention relates to semiconductor device assemblies comprising more than one component body within an envelope, each component body comprising a semiconductor component such as, for example, a power field effect transistor (hereinafter termed MOSFET) or an insulated gate bipolar transistor (hereinafter termed IGBT). Such device assemblies may be used in, for example, controlled half-wave or full-wave rectifiers and/or in half-bridge or full-bridge driver circuits. The invention further relates to circuits comprising such assemblies.

Published United Kingdom Patent Application GB-A-2 037 075 discloses a semiconductor device assembly comprising first and second (lower and upper) component bodies within an envelope. The lower component body is mounted on a first metal washer on a base of the envelope, the upper component body is mounted on a second metal washer on the first component body, and separate connection terminals are soldered to the first and second metal washers. A further connection terminal is soldered to a third metal washer on top of the upper component body. In the embodiments of FIGS. 9 to 11 of GB-A-2 037 075, each component body comprises a thyristor having a top main electrode and a control electrode which are located at an opposite major surface of its component body to the bottom main electrode. In the FIG. 10 embodiment, the second washer and upper component body are mounted eccentrically on the lower component body to leave uncovered a bonding pad of the control electrode of the lower component body. The whole contents of GB-A-2 037 075 are hereby incorporated herein as reference material.

SUMMARY OF THE INVENTION

It is an aim of the present invention to provide a lower-cost and more convenient (but reliable) device assembly, which can be manufactured in a more simple manner and which also allows for a more reliable operation by the preferred inclusion of thermal overload protection within the device assembly.

According to the present invention there is provided a semiconductor device assembly comprising, within an envelope, first and second (lower and upper) component bodies, a mounting pad, and conductor leads of a lead frame, wherein the first (lower) component body comprises a semiconductor component having a top main electrode, and a control electrode which are located at an opposite major surface of its component body to a bottom main electrode, the second component body comprises a semiconductor component having at least a top main electrode at an opposite major surface of its component body to a bottom main electrode, each top main electrode and control electrode of the first and second component bodies has a respective bonding pad to which a respective electrical connection is bonded from a respective conductor lead of the lead frame, the first (lower) component body is mounted on the mounting pad with its bottom main electrode bonded to the mounting pad, and the second (upper) component body is mounted on a part of the lower component body to leave uncovered the bonding pads of the top main electrode and control electrode of the lower component body, the bottom electrode of the upper component body being bonded to the top main electrode of the lower component body.

In this manner a compact and low-cost semiconductor device assembly can be obtained with comparatively simple lead-frame connections to the top main electrodes and the control electrode of the component bodies, and hence also to the bottom main electrode of the upper component body which is bonded to the top main electrode of the lower component body. The envelope and lead frame may even have a standard package outline. The lower and upper semiconductor components in this device assembly may form, for example, a half-bridge driver circuit or half-wave rectifier circuit.

Advantageously the lower component body may comprise a thermal-overload protection circuit having a temperature sensor which is located adjacent to its said opposite major surface and also adjacent to where the upper component body is mounted. Due to an intimate thermal contact between the first and second component bodies, the protection circuit in the lower body can serve to protect both the lower and upper semiconductor components against thermal overload. This arrangement is particularly beneficial when the semiconductor components are power devices, for example, MOSTs or IGE BTs or other power transistors. Such a thermal-overload protection circuit provides a temperature safeguard for the intimately-mounted device assembly without requiring the thick and expensive metal washers of GB-A-2 037 075. Furthermore, this protection circuit can be readily accommodated with a larger surface area to the lower component body serving to provide a large mounting area for the upper body or bodies and so facilitating the assembly process during manufacture.

The thermal-overload protection circuit may have one or more temperature sensors which are sandwiched between the lower and upper component bodies, by being located at the part of the lower component body on which the upper component body is mounted. However, the temperature sensor or sensors may be located in the vicinity of the upper component body without being sandwiched thereunder. Furthermore, as described hereinafter, a thermal-overload protection circuit incorporated in the lower component body may have both hot-location and cool-location temperature sensors, the cool-location temperature sensors being remote from heat-generating areas of the component bodies.

The lower component body may comprise two semiconductor components which have a common bottom main electrode at one major surface of the lower component body and which each has an individual top main electrode at the opposite major surface; the second (upper) component body may be mounted where one of the two semiconductor components of the lower component body is located This arrangement is particularly advantageous for power transistors and similar components which have both a common region and a common main electrode adjacent their bottom major surface. A compact arrangement is possible in which the two components of the lower component body have control electrodes with a common bonding pad for the two components. When the lower component body includes a thermal-overload protection circuit and/or an input control circuit between the control electrode of these components and their control-electrode bonding pad, the thermal-overload protection circuit and/or an input control circuit can be (at least in part) common for the two components.

Such an arrangement having two components in the lower body and having a second component body mounted thereon may provide a compact device assembly for, for example, a solenoid driver circuit as described below. However, such an arrangement may also be used to provide a compact assembly for a full-bridge driver circuit or full-wave rectifier circuit.

Thus, for example, a full-bridge driver circuit and/or full-wave rectifier circuit can be formed by mounting a third component body on another part of the first, lower component body where the other of the two semiconductor components is present. This upper third component body may comprise a semiconductor component having a top main electrode and a control electrode which are located at the opposite major surface of its component body to a bottom main electrode. Respective electrical connections are bonded to the top main electrode and control electrode of the third component body from respective conductor leads of the lead frame. The bottom electrode of the third component body may be bonded to the top main electrode of said other of the two semiconductor components of the lower component body, while leaving uncovered the bonding pads of the top main electrode and control electrode of said other of the two semiconductor components.

A variety of techniques may be used to bond the main electrodes of the component bodies together. In one particularly convenient form, an intermediate film of electrically and thermally conductive adhesive may be used to bond the top main electrode of the lower component body to the bottom main electrode of the component body mounted thereon. A conductive adhesive provides a particularly simple, low cost, and reliable bonding method. In another form, an intermediate film of solder may be used instead of an adhesive. It is also possible to dispense with any intermediate additional film. Thus, the top main electrode(s) of the lower component body and the bottom main electrode of the component body or bodies mounted thereon may each comprise a respective layer of fusible and/or alloyable metal, the respective layers being fused and/or alloyed together to bond the top main electrode of the first component body to the bottom main electrode of the component body mounted thereon.

BRIEF DESCRIPTION OF THE DRAWINGS

These and other features in accordance with the present invention, and their advantages, are illustrated specifically in embodiments of the invention now to be described, by way of example, with reference to the accompanying diagrammatic drawings, in which.

Figure 1:
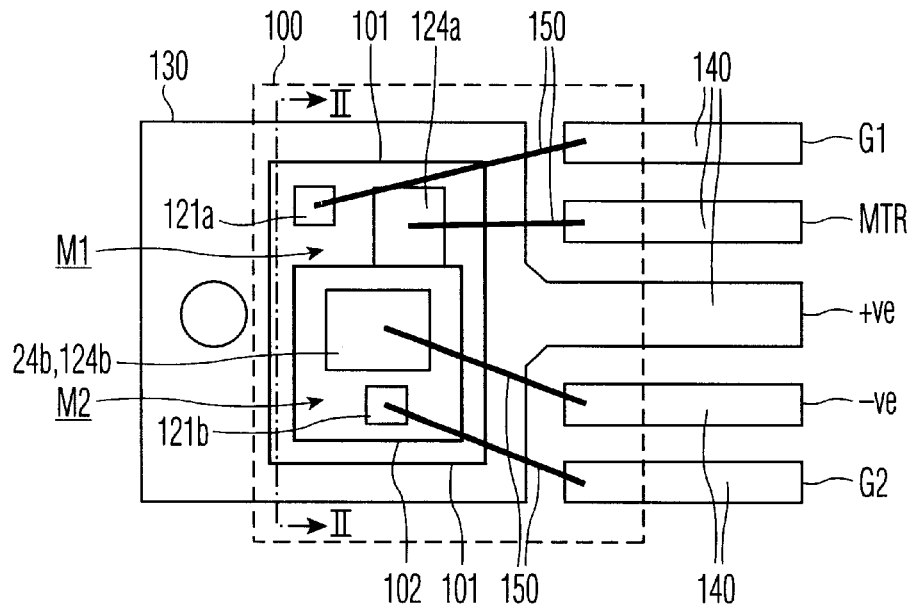
FIG. 1 is a plan view of a first embodiment of a semiconductor device assembly in accordance with the present invention, and comprising first and second component bodies.

It should be noted that all the Figures are diagrammatic and not drawn to scale. Relative dimensions and proportions of parts of FIGS. 1 to 7 and 12 are shown exaggerated or reduced in size, for the sake of clarity and convenience in the drawings. The same reference signs are generally used to refer to corresponding or similar features in the different embodiments.

DESCRIPTION OF THE PREFERRED EMBODIMENTS

Figure 2:
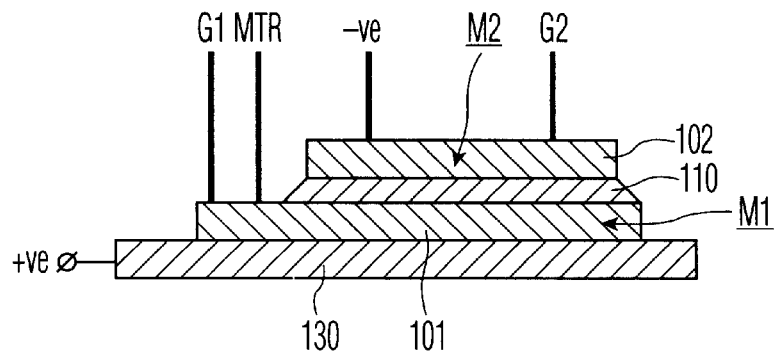
FIG. 2 is a cross-sectional view on the line II—II of FIG. 1.

The semiconductor device assembly of FIGS. 1 and 2 comprises first and second (lower and upper) component bodies 101 and 102 respectively, within an envelope which is illustrated by broken outline 100 in FIG. 2. A mounting pad 130 and individual conductor leads 140 of a conductive sheet-metal lead frame are also present within the envelope 100. In the particular example illustrated in FIG. 1, the mounting pad 130 is integrally formed with the lead frame. The envelope 100 may be of a known hard plastics material which is moulded around the lead frame after the component bodies 101,102 are mounted on the pad 130. The envelope 100 may form a standard package outline with the leads 140. Thus, for example, the outline illustrated in FIG. 1 may be a standard TO220 package in which the pad 130 protrudes as an apertured mounting plate from the end of the envelope opposite the leads 140. This apertured mounting plate permits efficient heat-sinking of the component bodies 101 and 102. However, an additional temperature control measure is incorporated in the device assembly of FIGS. 1 and 2, in the form of a thermal-overload protection circuit D1,Q1 etc, as described below.

Figure 4:
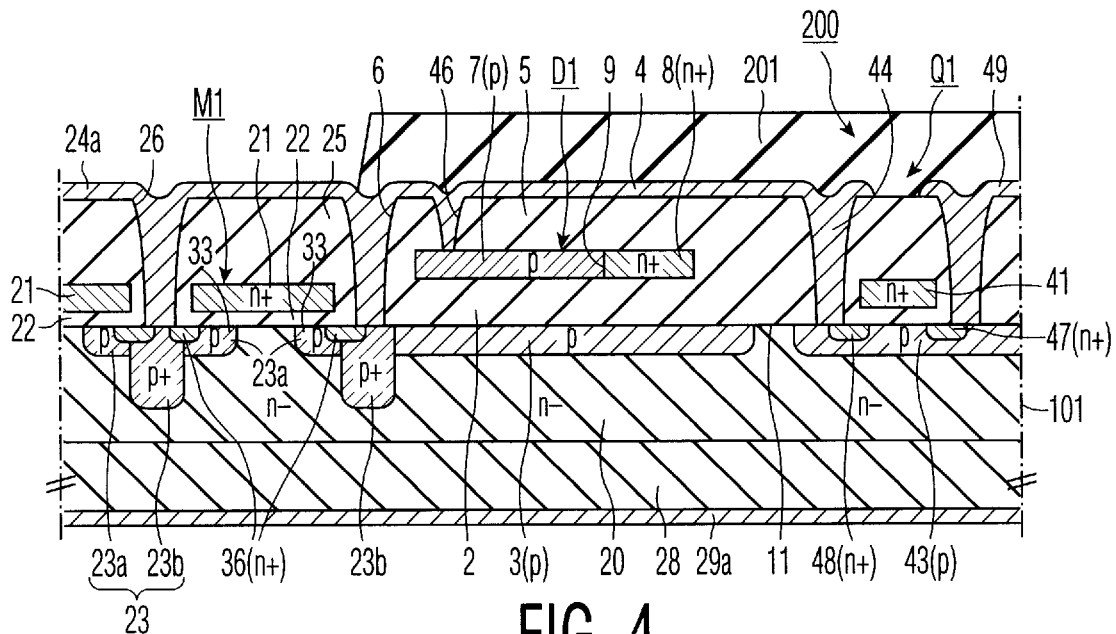
FIG. 4 is a cross-sectional view through a portion of a first component body comprising a thermal overload protection circuit.

Each of the component bodies 101,102 comprises a respective semiconductor component M1 and M2 having a top main electrode 24 and a control electrode 21, both of which are located at an opposite major surface of its component body to a bottom main electrode 29. In the particular examples illustrated in FIGS. 4 to 6, the semiconductor components are power MOSFETs or IGBTs. The semiconductor bulk of the bodies 101 and 102 is of silicon. FIG. 4 illustrates a particular example of a power transistor which is similar to that of FIG. 1 of published PCT International Application WO-A-97/02592 (Our Ref: PHB 33990). The component body 101 of FIG. 4 comprises a thermal-overload protection circuit D1,Q1 etc in addition to the power transistor M1. The whole contents of WO-A-97/02592 are hereby incorporated herein as reference material.

Figure 5:
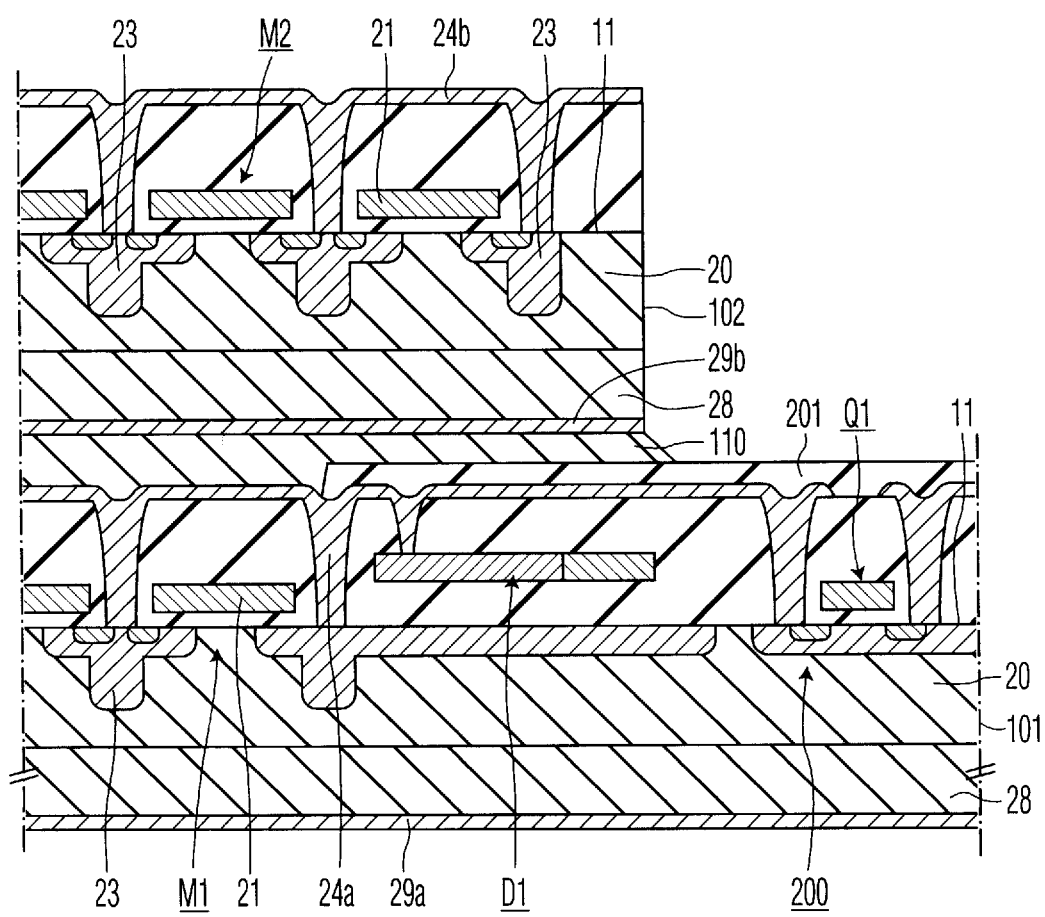
FIG. 5 is a cross-sectional view of part of the body portion of FIG. 4 with a second component body mounted thereon.
Figure 6:
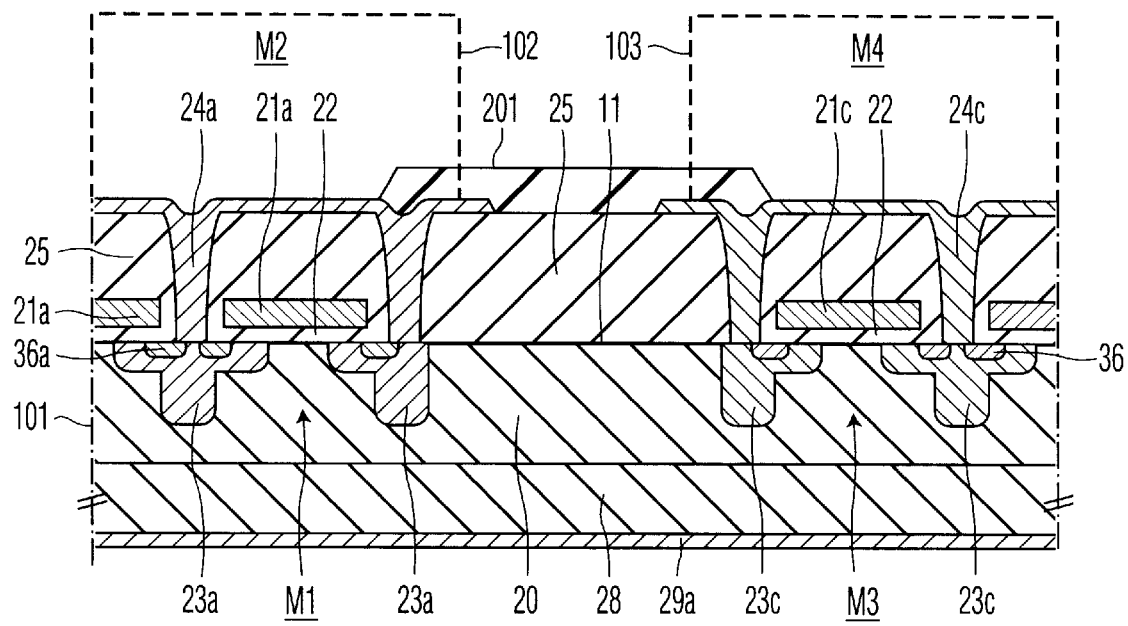
FIG. 6 is a cross-sectional view of a portion of a first component body comprising two semiconductor components M1 and M3.

In the particular examples of FIGS. 4, 5 and 6, the power transistors M1,M2 etc are of known cellular form, each cell comprising a region 23 of one conductivity type which accommodates a channel area 33 of the transistor below an insulated gate 21. The cell structure is similar to that disclosed in WO-A-97/02592. Thus, the transistor M1 illustrated in FIG. 4, by way of example, is of the n-channel enhancement type having a p-type region 23. Each cell has individual n-type source regions 36 in the p-type region 23. The cellular regions 23 are present in an n-type drain drift region 20 of high resistivity (n-). In the case of a MOSFET or an IGBT, the control electrode of the transistor M1 is the insulated gate 21. The gate 21 may be formed by a doped polycrystalline silicon layer pattern on a gate dielectric layer 22 on the major surface 11 of the component body. The gate 21 is covered with a further insulating layer 25 which may be of a flowable glass or polymer material so as to give a smooth flat upper surface across the component body. Although FIGS. 4, 5 and 6 illustrate a planar cellular geometry for the channel area 33 and the gate 21, various known forms of so-called "trench-gate" geometry may be used for MOSFETs and IGBTs in a device assembly in accordance with the invention, in which the insulated gate 21 is present in a trench in the major surface 11 of the component body, between neighbouring cells. In this case, the gate dielectric layer 22 extends over the side walls and bottom of the trench, and the channel area 33 extends vertically along the side walls of the trench.

The top main electrode 24 is a source electrode in the case of a MOSFET and a cathode electrode in the case of an IGBT. It is formed of an electrically conductive layer pattern (for example of aluminum) which contacts the source regions 36 and body regions 23 at windows 26 in the insulating layers 22,25. This top main electrode 24 extends over the insulated layer 25 over the insulated gate 21 between the windows 26. An integral area of the conductive layer pattern provides the electrode 24 with an integral bonding pad 124, to which electrical connections such as wires 150 are bonded. A bonding pad 121 for the gate electrode 21 is also formed on the dielectric layer 25 by an isolated area of the electrically conductive layer pattern which provides the main electrode 24 and its bonding pad 124. These areas 24,124 and 121 of the conductive layer pattern (which are exposed, flat, conductive areas at the upper major surface of the respective component body) are shown designated with suffix "a" for the lower component body 101 in FIG. 3 and designated with suffix "b" for the upper component body 102 in FIG. 1.

The gate bonding pad 121 may directly contact the gate electrode 21 at windows (not shown) in the insulating layer 25. Alternatively, the gate bonding pad 121 may be coupled to the gate electrode 21 by a gate control circuit 200 of known type comprising, for example, semiconductor resistors, diodes and/or transistor switches so as to control, in known manner, the voltage applied to the gate 21 from the bonding pad 121 in accordance with the operational state of the MOSFET/IGBT. As illustrated in FIG. 4, a protective insulating overlayer 201 of, for example, silicon nitride, may be present over the gate control circuit 200 in the component body. The electrode bonding pads 124 and 121 are exposed at windows in this insulating overlayer 201. One or more of the gate control circuits 200 may be integrated with one or more temperature sensors (for example D1) to provide thermal protection for the MOSFET/IGBTs in the device assembly. There are a large variety of known types of temperature sensors and thermal-protection circuits which may be integrated in the lower body 101 in a device assembly in accordance with the present invention. By way of one specific example, FIG. 4 illustrates temperature sensing using a thin-film diode D1 in a type of circuit as disclosed in WO-A-97/02592. Other known types of sensors and circuits are also referenced in WO-A-97/02592, and further types are also mentioned hereinafter.

The semiconductor component is of vertical configuration, and so it has its other main electrode 29 at the bottom major surface of the component body. This bottom main electrode 29 is a drain electrode for a MOSFET or an anode electrode for an IGBT. The electrode 29 contacts a semiconductor substrate 28 of the component body. This substrate 28 is of the same conductivity type as the drain drift region 20 in the case of a MOSFET, or it is of opposite conductivity type to the drain drift region 20 in the case of an IGBT.

In a specific example, typical dimensions and compositions for the various regions and layers are as follows:

1 $\mu$m to 10 $\mu$m thickness for the conductive layer 24,124 and 121 of aluminum;
 0.3 to 3 $\mu$m thickness of silicon nitride for the insulating overlayer 201;
 0.5 to 2 $\mu$m thickness of silicon dioxide for the insulating layer 25;
 0.2 to 5 $\mu$m thickness of polycrystalline silicon for the gate layer pattern 21;
 0.3 to 2 $\mu$m thickness of silicon dioxide for the gate insulating layer 22; and
 0.5 to 3 $\mu$m thickness of a TiNiAg alloy for the bottom electrode layer 29.

Other dimensions, materials and doping concentrations of the component bodies 101 and 102 and their constituent parts can be chosen in known manner in accordance with the desired operational characteristics for the semiconductor components M1,M2 etc. The lead-frame (with its leads 140, tie bar 145 and integral mounting pad 130) may be stamped in known manner from a copper sheet having a thickness of typically 1 mm to 2 mm (for example 1.3 mm) and plated with a covering layer of, for example, nickel having a thickness of, for example, 2 $\mu$m.

Figure 3:
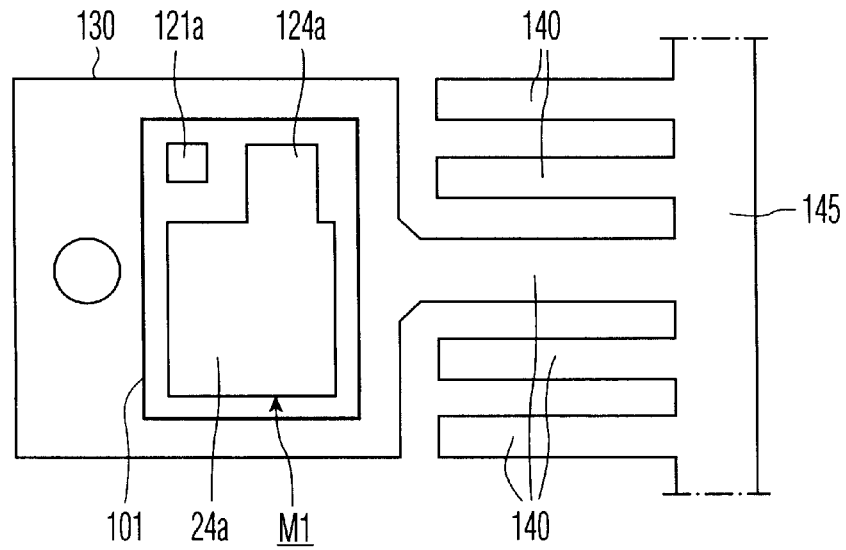
FIG. 3 is a plan view of the assembly of FIG. 1 at a stage in its manufacture, showing the first component body mounted on a lead-frame.

The device assembly of FIGS. 1 and 2 is made by mounting the lower component body 101 on the lead-frame pad 130 (as illustrated in FIG. 3) and bonding its bottom main electrode 29a to the mounting pad 130, for example by soldering using a lead-tin solder. Thus, a direct electrical connection is formed between the bottom electrode 29a of the power transistor M1 and one of the conductor leads 140 of the lead frame, which is integral with the pad 130. The resulting structure is illustrated in FIG. 3.

The second component body 102 is now mounted on a part of the first component body 101 to leave uncovered the bonding pads 124a,121a of the top main electrode 24a and control electrode 21 of the transistor M1. The bottom electrode 29b of the transistor M2 of the body 102 is bonded to the top main electrode 24a of the transistor M1 of the body 101. This direct mechanical and electrical connection of the electrodes 24a and 29b can be achieved advantageously by, for example, an intermediate film of electrically and thermally conductive epoxy adhesive 110 which is printed on the electrode 24a before mounting the body 102. A known type of adhesive-dispensing die bonder may be used for this purpose. The film 110 may be typically about 5 to 30 $\mu$m thick. The resulting structure of the bodies 101 and 102 bonded together is illustrated in FIG. 5. The top main electrode 24 of the lower body 101 extends out from below the upper body 102 to form the bond pad 124a which provides a common connection also to the bottom main electrode 29b of the upper body 102, as illustrated in FIG. 1.

As illustrated in FIGS. 1 and 2, electrical connections 150 in the form of, for example, aluminum wires are bonded from respective conductor leads 140 of the lead-frame to the electrode bonding pads 121a,124a,121b,124b. The wire connections 150 for the lower body 101 may be provided before mounting the upper body 102, or they may be provided at the same stage as the wire connections 150 for the upper body 102. The plastics envelope 100 is then moulded in known manner around this connected assembly, leaving part of the mounting pad 130 and conductor leads 140 outside the envelope 100 to form the external terminals of the device assembly. The main tie bar 145 of the lead frame is then severed to leave the completed device assembly illustrated in FIG. 1. The FIG. 1 device assembly of transistors M1 and M2 may be used to provide, for example, a half-bridge driver for the motor driving circuit illustrated in FIG. 8.

Figure 8:
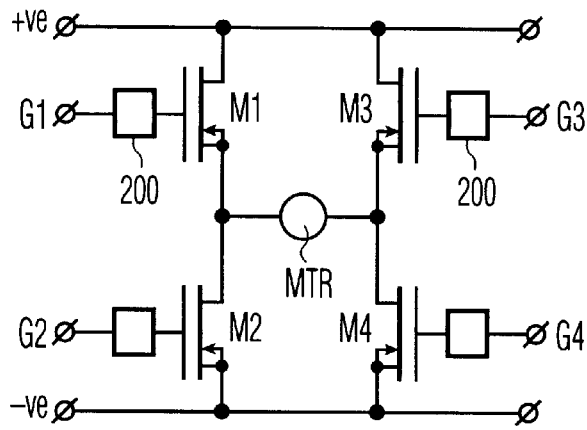
FIG. 8 is a circuit diagram of a full-bridge driver circuit realisable with one or more device assemblies in accordance with the present invention.

The circuit of FIG. 8 may be used in, for example, an automotive application to drive electrically a reversing motor MTR, for example, for mechanically adjusting a mirror or a seat in the automobile. This full-bridge driver comprises four controlled switches M1,M2,M3,M4, for example, MOSFETs, which are connected between the motor MTR and the +ve and −ve power supply lines. The high-side MOSFET switches M1 and M3 have their drain terminals coupled to the +ve supply line, whereas the low-side MOSFET switches M2 and M4 have their source terminals coupled to the −ve supply line. Each MOSFET switch M1 to M4 has a respective control terminal G1 to G4. These designations G1, G2, MTR, +ve and −ve are added to FIG. 1 to show how the assembly of FIG. 1 may be used to provide one half of the full-bridge driver circuit of FIG. 8. Thus, in this FIG. 8 circuit the motor MTR is coupled to the bonding pad 124a of the top main electrode 24a of the lower component body 101 via the respective conductor lead 140 of the envelope 100.

Similarly the MOSFETs M3 and M4 may be formed in lower and upper bodies 101 and 102 respectively to provide a similar construction for the other half of the full-bridge driver circuit. Thus, the full-bridge driver circuit of FIG. 8 can be realised using two FIG. 1 device assemblies, each in its own envelope 100. However, as described below, such an assembly configuration can be extended to provide a full-bridge driver circuit with all the switches M1 to M4 in one single envelope 100.

Generally, it is advantageous for the lower component body 101 to have a wider area than the upper component body 102. This wider area provides a mechanically stable support for the upper body 102 during manufacture, without covering the bonding pads 124a,121a of the lower body 101 to which connections 150 are to be made. The wider area of the lower body 101 can readily accommodate a gate control circuit 200 and a thermal-overload protection circuit D1,Q1 etc, as already described. It is also possible to accommodate more thai one power device M1 in the wider lower body 101.

Thus, by way of example, FIG. 6 illustrates two power MOSFETs or IGBTs M1 and M3 formed side-by-side in the body 101 and sharing a common drain drift region 20, a common drain/anode substrate region 28, and a common bottom main electrode 29a. These transistors M1 and M3 have their own separate regions 23 and 36, their own separate gate electrodes 21, and their own separate top main electrodes 24a and 24c. They may have a common gate control pad 121a or their own separate gate control pads 121a and 121c. In the same way as for FIGS. 1 and 2, a second body 102 comprising a power transistor M2 is mounted on the part of the body 101 where M1 is located.

Figure 7:
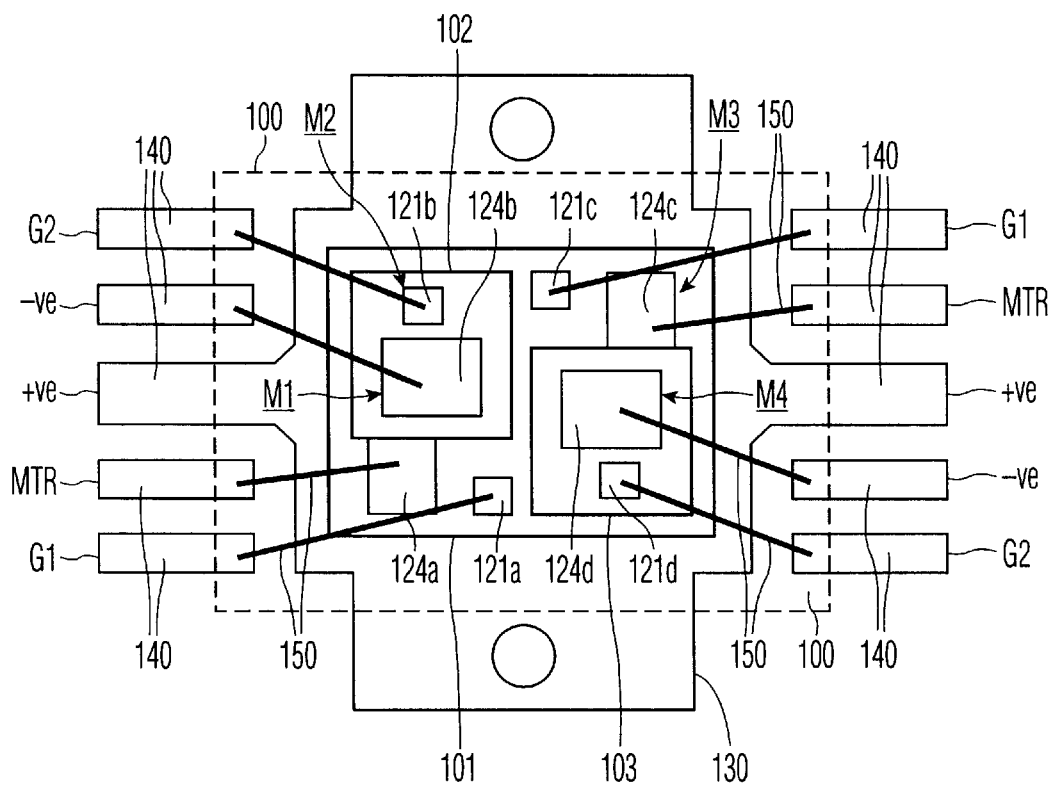
FIG. 7 is a plan view of another semiconductor device assembly in accordance with the present invention comprising three compound bodies.

Similarly, a third body 103 comprising a similar power transistor M4 may be mounted on the part of the lower body 101 where M2 is located. The bottom main electrode 29d of M4 is bonded to the top main electrode 24c of M3, in the same way that the electrode 29b of M2 is bonded to the electrode 24a of M1. The electrode bonding pads 121c and 124c of M3 extend out from below the body 103 in the same way that 121a and 124a do from below the body 102. The exposed electrode pads 121a,124a of M1, 121b,124b of M2, 121c,124c of M3, and 121d,124d of M4 are respectively connected by individual bonded wires 150 to respective leads 140 of the device lead frame. An example of this device assembly of M1,M2,M3,M4 in three component bodies 101,102,103 all within a single plastics envelope 100 is illustrated in FIGS. 6 and 7. Thus, the full-wave bridge driver circuit of FIG. 8 can be realised with this device assembly comprising all four switches M1 to M4 in a single envelope 100. In this form of the FIG. 8 circuit, the motor MTR is coupled to the bonding pad 124a (and 124c) of the top main electrodes 24a and 24c of the two components M1 and M3 of the lower component body 101 via a respective conductor lead 140 of the envelope 100. Furthermore a modified layout of the FIG. 7 body 101 is possible in this form of the FIG. 8 circuit, in which the switches M1 and M3 in the lower body 101 share a common bonding pad 124a/c for their top main electrodes 24a and 24c.

Figure 9:
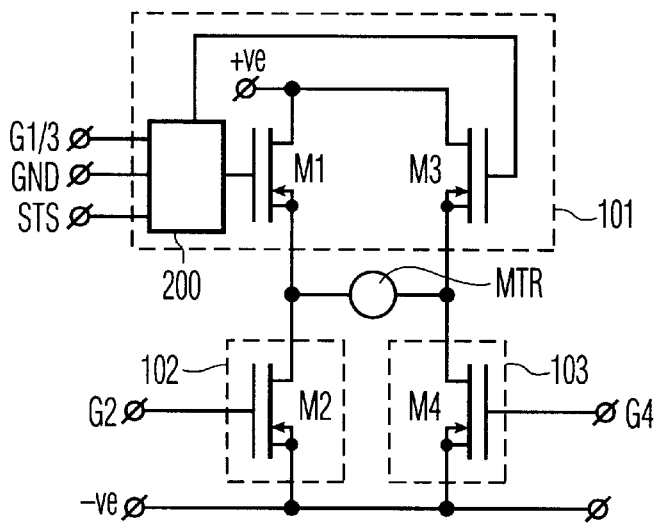
FIG. 9 is a circuit diagram of a variant of FIG. 8, which is also in accordance with the invention.

FIG. 9 illustrates a variant of the FIG. 8 circuit in which M1 and M3 share a common gate control circuit 200 from a common control terminal G1/3, i.e. from a common terminal lead 140 of the device assembly. This full-wave bridge driver circuit of FIG. 9 can also be realised with the device assembly of three bodies 101, 102 and 103 comprising all four switches M1 to M4 in a single envelope 100. As already known, gate control circuits 200 usually have an external ground terminal GND corresponding to a separate terminal lead 140 which is not shown in FIG. 7 (nor in FIG. 1, for simplicity of these drawings) but which is illustrated in FIG. 9. Furthermore, the gate control circuit 200 may similarly have one or more external status terminals STS, each corresponding to a separate terminal lead 140, by which the operational status of the devices M1 and M3 can be indicated, for example if M1 and M3 have been shut down by the thermal protection circuit having detected a thermal overload.

Figure 10:
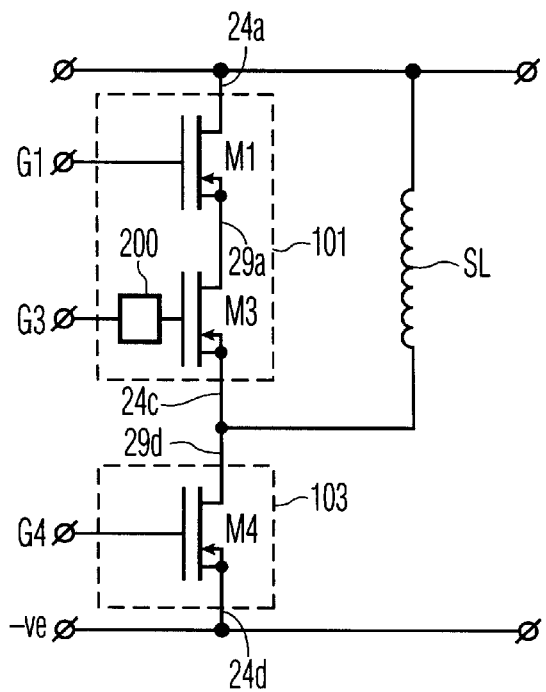
FIG. 10 is a circuit diagram of a solenoid driver circuit realisable with a device assembly in accordance with the present invention.

Also useful for circuit implementation is the assembly of three power devices M1,M2,M3 or M1,M3,M4 in one envelope 100. Thus, in the FIG. 6 embodiment, either the upper body 102 or the upper body 103 may be omitted to provide a device assembly of two component bodies within one single envelope. The lower body 101 comprises two components M1 and M3. Such a device assembly can provide a driver circuit for driving the coil SL of a solenoid, as illustrated in FIG. 10. Such solenoid drivers are desirable in, for example, automotive transmission controls and in anti-lock braking systems for automobiles. The solenoid coil SL is coupled to the bonding pad 124c of the top main electrode 24c of the lower component body 101 via its respective conductor lead 140 of the envelope 100.

Figure 11:
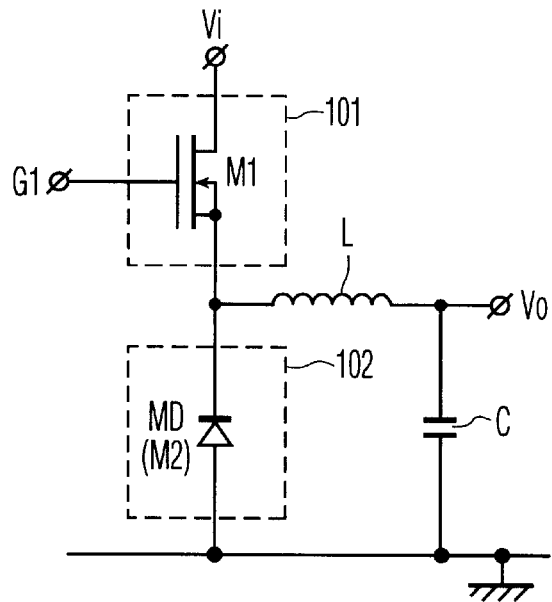
FIG. 11 is a circuit diagram of a voltage-level converter circuit realisable with a device assembly in accordance with the invention.

FIG. 11 illustrates another circuit configuration in which the device assembly of FIGS. 1 and 2 may be used for voltage level conversion. An input voltage (for example +5 volts) applied to an input terminal Vi is converted by this circuit into an output voltage level (for example +2.8 volts) at an output terminal Vo. The input terminal Vi is coupled to the bonding pad 124b of the top main electrode 24b of the upper component body 102 via the respective conductor lead 140 of the envelope 100. The voltage-level terminal Vo is coupled by an inductor-capacitor network L,C from the bonding pad 124a of the top main electrode 24a of the lower component body 101 via its respective conductor lead 140. A synchronous converter can be formed when the bodies 101 and 102 comprise MOSTs M1 and M2 in the series configuration of FIG. 11. However, the actual circuit illustrated in FIG. 11 is a non-synchronous converter in which the upper body 102 comprises a Schottky diode MD instead of the MOST M2. This Schottky diode MD is connected in the series configuration with M1 in a device assembly in accordance with the present invention, for example as illustrated in FIG. 12.

Figure 12:
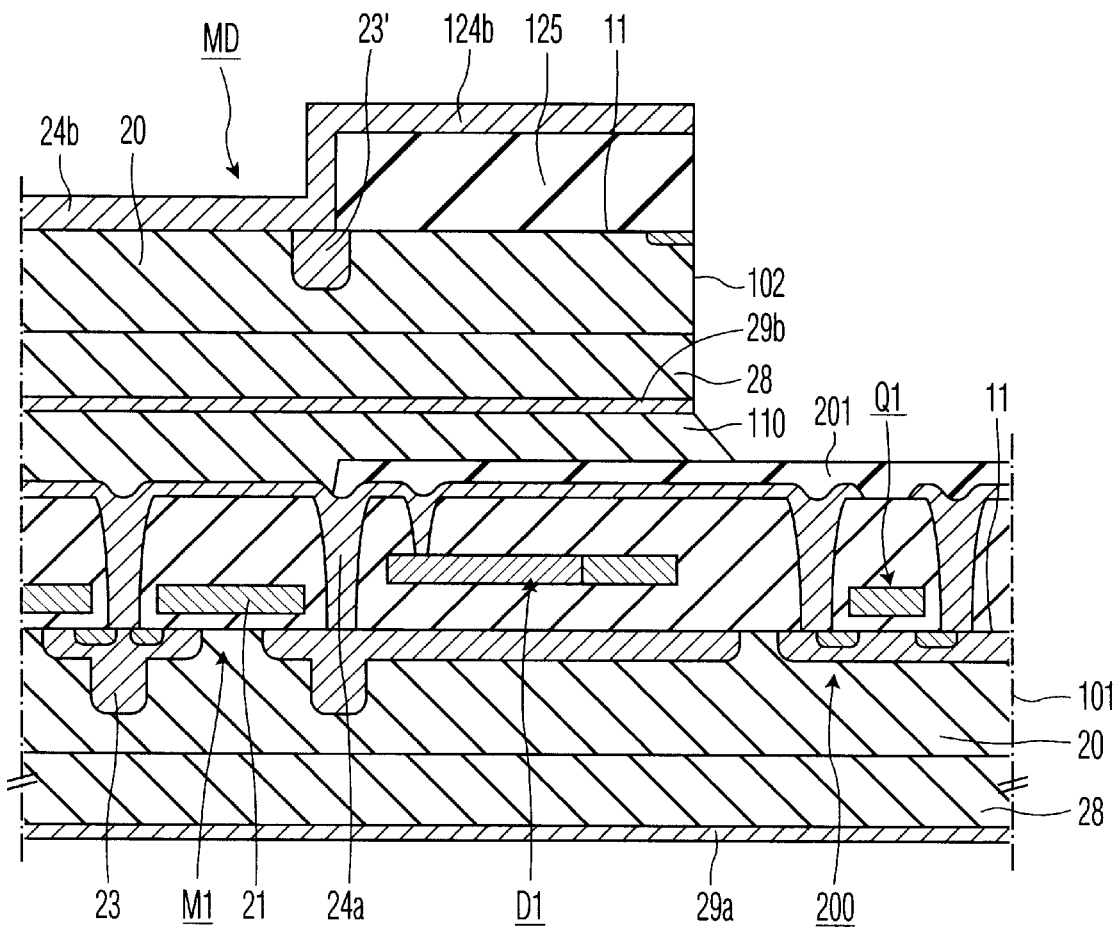
FIG. 12 is a cross-sectional view, similar to FIG. 5, of such a device assembly which is suitable for use in the circuit of FIG. 11.

Thus, FIG. 12 is a variant of FIG. 5, in which the upper body 102 comprises the Schottky diode MD instead of the MOST M2. The diode MD comprises an anode electrode 24b which forms a Schottky barrier with n-type epitaxial layer 20 at a window in an insulating layer 25 at the upper major surface of the body 102. A known form of p-type guard ring 23' may be present around the edge of the window. The n-type layer 20 is present on an n-type substrate 28 which is contacted at its opposite major surface by a cathode electrode 29b. As in FIG. 5, the conductive adhesive film 110 (or solder film 110) forms the desired direct electrical connection between electrodes 24a and 29b which thus share a common bonding pad 124a for its wire connection 150 to the leadframe.

The device assemblies of FIGS. 1 to 12 can be manufactured in a cost-effective manner using customary production equipment, without introducing reliability problems into the manufacturing process. The lower body 101 can be mounted on the lead frame pad 130 using known die-bonding processes, and the upper body 102 (or bodies 102,103) can be added after passing the lead frame 130,140,145 through another die-bonder which places adhesive 110 on the top main electrode(s) 24 of the lower body 101.

The provision of one power device M2 or M4 or MD directly on top of another M1 or M3 can aggravate potential overheating problems during circuit operation. However, the provision of a thermal-overload protection circuit in the device assembly in accordance with the invention protects the power devices against overheating. The inclusion of a thermal-overload protection circuit D1,Q1 etc in the lower body 101 can be achieved in known manner. The temperature sensor and/or sensors (for example a thin-film diode D1) may be located below the upper body 102 (or bodies 102,103) or outside the area covered by the upper body 102 or bodies 102 and 103. Thus, for example, FIGS. 5 and 12 illustrate the sensor D1 sandwiched between the bodies 101 and 102. In a three-body embodiment of FIGS. 6 and 10, one or more temperature sensors D1 may be located in an area of 101 between the two upper bodies 102 and 103, or sandwiched between the bodies 101 and 102 and/or 103. There is a large variety of different known types of temperature sensor which may be used. Thus, the temperature sensors themselves may be resistors or diodes or transistors, may have positive or negative temperature coefficients and may be formed as thin-film elements on an insulating layer 2 on the component body 101 or as semiconductor regions in the silicon bulk of the component body 101. In each case, the temperature sensor(s) is/are preferably covered with a protective electrically insulating overlayer 201.

The thermal-overload protection circuit may include a hysteresis circuit function which prevents the temperature sensing circuitry from hunting or cycling, i.e from continually causing the power device M1 and/or M3 to be switched off when only small temperature changes are sensed by the temperature sensor. Such a hysteresis circuit function is particularly beneficial when the temperature sensor has a high sensitivity, for example when it is in the form of a p-n junction thin-film diode. Due to its wider area, the lower body 101 can have adequate space for the layout of the thermal-overload protection circuit with such a hysteresis circuit function. The use of hysteresis circuits in temperature sensing of power semiconductor devices is already known in, for example WO-A-97/02592 and in, for example, United States Patents U.S. Pat. No. 5,444,219 (Our Ref: PHB 33735) and U.S. Pat. No. 5,563,760 (Our Ref: PHB 33667), the whole contents of which are hereby incorporated herein as reference material.

U.S. Pat. No. 5,444,219 and U.S. Pat. No. 5,563,760 also disclose the provision of temperature sensors in both hot and cold locations of a power device. The hot locations are closer to the heat-generating area of the power device than are the cold locations. A comparator circuit responsive to these differently-located sensors provides a control signal which can switch off the power device when the difference in temperature sensed in these two locations reaches a predetermined value. Such an arrangement may be adopted in a power device assembly in accordance with the present invention, the hot temperature sensor or sensors being below an upper body or bodies 102 and 103, and the cold sensors being in areas remote from these upper bodies 102 and 103.

Thus, in summary, there is provided a semiconductor device assembly comprising, within a plastics envelope 100, one or more upper component bodies 102, 103 mounted on at least one lower component body 101 to provide a low-cost, yet reliable half- or full-bridge driver or rectifier circuit or a solenoid driver circuit or the like. Each component body 101, 102, 103 comprises at least one (possibly more than one) MOSFET, IGBT, Schottky diode or other semiconductor component. A bottom main electrode 29a of the lower body 101 is bonded to a mounting pad 130 in the envelope 100. Electrical connections 150 are bonded from conductor leads 140 of the envelope lead frame 130, 140 to respective bonding pacts 124a/b/c, and 121a/b/c of top electrodes 24a/b/c, 21a/b/c of each of the bodies 101, 102, 103. The lead-frame connection 150 to the bottom electrode 29b/d of the upper body 102, 103 is via the top main electrode 24a/c of the lower body 101, to which it is bonded without covering the electrode bonding pads 124a/c, 121a/c of the lower body 101. A large mounting area for the upper body/bodies 102, 103 and good thermal protection for the whole assembly is achieved, by including in the lower body 101 a thermal-overload protection circuit D1, Q1 . . . , which has a temperature sensor D1 at a location adjacent to the area of the top surface of the lower body 101 where the upper body 102 or bodies 102, 103 is/are mounted. The top electrodes 24a/b/c, 21a/b/c are in contact with device areas of their respective component M1, M2, M3, M4, Md via windows in an insulating layer structure 21,25 at the upper major surface 11 of their component body 101, 102, 103. The bonding pads 124a/b/c, 121a/b/c of the top electrodes are present on this insulating layer structure 21,25. Preferably a protective insulating layer 201 is present over the upper major surface 11 of the lower component body 101 (over the temperature sensor D and any other circuitry in the body 101), except that the top main electrode 24a and bonding pads 124a and 121a are exposed at windows in this protective layer 201.

In the particular embodiment described above, an epoxy adhesive film 110 was used to bond the lower and upper bodies 101 and 102,103 together by the direct mechanical and electrical connection of their electrodes 24a and 29b. However, instead of an adhesive, a solder material may be provided to form the film 110. When the bonded area of the electrode 24a is present at a window in a protective insulating overlayer 201, the film 110 needs to be thicker than overlayer 201. In a further modification, the top main electrode 24a of the body 101 may be bonded to the bottom electrode layer of the body 102,103 by fusing and/or alloying together these layers. Thus, the top bonding pad 124a of the first body 101 may be coated with a first layer of fusible and/or alloyable metal, and the bottom major surface of the body 102,103 may be coated with a second layer of fusible and/or alloyable metal in addition to (or instead of) the bottom electrode layer 29b. In this case, metal to metal bonding can be achieved in known manner using, for example, ultrasonic and/or thermal energy to form a weld or alloyed joint. The same or different materials may be used for these first and second layers. Thus, if an aluminum layer is provided on or as the bottom electrode layer 29b, this bottom aluminum layer of the upper body 102,103 can be fused directly with the top aluminum electrode pad 124a of the body 101. Alternatively, for example, a silver electrode pad 124a of the body 101 can be alloyed directly to a TiNi(Au—Ge) bottom electrode layer 29b of the upper body 102,103.

From reading the present disclosure, other modifications and variations will be apparent to persons skilled in the art. Such modifications and variations may involve equivalent features and other features which are already known in the art and which may be used instead of or in addition to features already disclosed herein.

What is claimed is:

1. A semiconductor device assembly comprising, within an envelope, first and second component bodies, a mounting pad, and conductor leads of a lead frame, wherein the first component body comprises a respective semiconductor component having a top main electrode and a control electrode which are located at an opposite major surface of the first component body to a bottom main electrode, the second component body comprises a semiconductor component having at least a top main electrode at an opposite major surface of the second component body to a bottom main electrode, each top main electrode and control electrode of the first and second component bodies has a respective bonding pad to which a respective electrical connection is bonded from a respective conductor lead of the lead frame, the first component body is mounted on the mounting pad with the bottom main electrode of the first component body bonded to the mounting pad, and the second component body is mounted on a part of the first component body to leave uncovered the bonding pads of the top main electrode and control electrode of the first component body, the bottom electrode of the second component body being bonded to the top main electrode of the first component body.

2. A semiconductor device assembly as claimed in claim 1, wherein the first component body comprises a thermal-overload protection circuit having a temperature sensor which is located adjacent to said opposite major surface of the first component body and adjacent to where the second component body is mounted.

3. A semiconductor device assembly as claimed in claim 1, wherein the first component body comprises two semiconductor components which have a common bottom main electrode at one major surface of the first component body and which each has an individual top main electrode at the opposite major surface, and the second component body is mounted at the location of one of the two semiconductor components of the first component body.

4. A semiconductor device assembly as claimed in claim 3, wherein a third component body is mounted on a part of the first component body where the other of the two semiconductor components is present, the third component body comprises a semiconductor component having a top main electrode and a control electrode which are located at an opposite major surface of the third component body to a bottom main electrode, respective electrical connections are bonded to the top main electrode and control electrode of the third component body from respective conductor leads of the lead frame, and the bottom electrode of the third component body is bonded to the top main electrode of said other of the two semiconductor components, while leaving uncovered the bonding pads of the top main electrode and control electrode of said other of the two semiconductor components.

5. A semiconductor device assembly as claimed in claim 3, wherein the two components of the first component body have control electrodes with a common bonding pad for the two components.

6. A semiconductor device assembly as claimed in claim 1, wherein the component of the second component body has a control electrode which is located at the same major surface as the top main electrode of the second component body and which has a bonding pad to which a respective electrical connection is bonded from a respective conductor lead of the lead frame.

7. A semiconductor device assembly as claimed in claim 1, wherein an intermediate film of electrically and thermally conductive adhesive or solder bonds the top main electrode of the first component body to the bottom main electrode of the component body mounted thereon.

8. A half-bridge driver circuit for driving an electric motor and comprising a semiconductor device assembly comprising, within an envelope, first and second component bodies, a mounting pad, and conductor leads of a lead frame, wherein the first component body comprises a respective semiconductor component having a top main electrode and a control electrode which are located at an opposite major surface of the first component body to a bottom main electrode, the second component body comprises a semiconductor component having at least a top main electrode at an opposite major surface of the second component body to a bottom main electrode, each top main electrode and control electrode of the first and second component bodies has a respective bonding pad to which a respective electrical connection is bonded from a respective conductor lead of the lead frame, the first component body is mounted on the mounting pad with the bottom main electrode of the first component body bonded to the mounting pad, and the second component body is mounted on a part of the first component body to leave uncovered the bonding pads of the top main electrode and control electrode of the first component body, the bottom electrode of the second component body being bonded to the top main electrode of the first component body, wherein the component of the second component body has a control electrode which is located at the same major surface as the top main electrode of the second component body and which has a bonding pad to which a respective electrical connection is bonded from a respective conductor lead of the lead frame, and wherein the motor is coupled to the bonding pad of the top main electrode of the first component body via its respective conductor lead.

9. A solenoid driver circuit for driving a solenoid coil and comprising a semiconductor device assembly comprising, within an envelope, first and second component bodies, a mounting pad, and conductor leads of a lead frame, wherein the first component body comprises a respective semiconductor component having a top main electrode and a control electrode which are located at an opposite major surface of the first component body to a bottom main electrode, the second component body comprises a semiconductor component having at least a top main electrode at an opposite major surface of the second component body to a bottom main electrode, each top main electrode and control electrode of the first and second component bodies has a respective bonding pad to which a respective electrical connection is bonded from a respective conductor lead of the lead frame, the first component body is mounted on the mounting pad with the bottom main electrode of the first component body bonded to the mounting pad, and the second component body is mounted on a part of the first component body to leave uncovered the bonding pads of the top main electrode and control electrode of the first component body, wherein the first component body comprises two semiconductor components which have a common bottom main electrode at one major surface of the first component body and which each has an individual top main electrode at the opposite major surface, and the second component body is mounted at the location of one of the two semiconductor components of the first component body, and wherein the solenoid coil is coupled to the bonding pad of the top main electrode of the first component body via its respective conductor lead.

10. A full-bridge driver circuit for driving an electric motor and comprising a semiconductor device assembly comprising, within an envelope, first and second component bodies, a mounting pad, and conductor leads of a lead frame, wherein the first component body comprises a respective semiconductor component having a top main electrode and a control electrode which are located at an opposite major surface of the first component body to a bottom main electrode, the second component body comprises a semiconductor component having at least a top main electrode at an opposite major surface of the second component body to a bottom main electrode, each top main electrode and control electrode of the first and second component bodies has a respective bonding pad to which a respective electrical connection is bonded from a respective conductor lead of the lead frame, the first component body is mounted on the mounting pad with the bottom main electrode of the first component body bonded to the mounting pad, and the second component body is mounted on a part of the first component body to leave uncovered the bonding pads of the top main electrode and control electrode of the first component body, wherein the first component body comprises two semiconductor components which have a common bottom main electrode at one major surface of the first component body and which each has an individual top main electrode at the opposite major surface, and the second component body is mounted at the location of one of the two semiconductor components of the first component body, wherein a third component body is mounted on a part of the first component body where the other of the two semiconductor components is present, the third component body comprises a semiconductor component having a top main electrode and a control electrode which are located at an opposite major surface of the third component body to a bottom main electrode, respective electrical connections are bonded to the top main electrode and control electrode of the third component body from respective conductor leads of the lead frame, and the bottom electrode of the third component body is bonded to the top main electrode of said other of the two semiconductor components, while leaving uncovered the bonding pads of the top main electrode and control electrode of said other of the two semiconductor components, and wherein the motor is coupled to the bonding pad of the top main electrodes of the two components of the first component body via its respective conductor lead.

11. A voltage-level converter circuit comprising a semiconductor device assembly comprising, within an envelope, first and second component bodies, a mounting pad, and conductor leads of a lead frame, wherein the first component body comprises a respective semiconductor component having a top main electrode and a control electrode which are located at an opposite major surface of the first component body to a bottom main electrode, the second component body comprises a semiconductor component having at least a top main electrode at an opposite major surface of the second component body to a bottom main electrode, each top main electrode and control electrode of the first and second component bodies has a respective bonding pad to which a respective electrical connection is bonded from a respective conductor lead of the lead frame, the first component body is mounted on the mounting pad with the bottom main electrode of the first component body bonded to the mounting pad, and the second component body is mounted on a part of the first component body to leave uncovered the bonding pads of the top main electrode and control electrode of the first component body, and wherein an output voltage-level terminal is coupled from the bonding pad of the top main electrode of the first component body via its respective conductor lead.

* * * * *